(12) United States Patent
Yokokawa

(10) Patent No.: US 12,707,944 B2
(45) Date of Patent: Aug. 11, 2026

(54) METHOD FOR MANUFACTURING SOI WAFER AND SOI WAFER

(71) Applicant: SHIN-ETSU HANDOTAI CO., LTD., Tokyo (JP)

(72) Inventor: Isao Yokokawa, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 493 days.

(21) Appl. No.: 18/024,194

(22) PCT Filed: Jul. 27, 2021

(86) PCT No.: PCT/JP2021/027635
§ 371 (c)(1),
(2) Date: Mar. 1, 2023

(87) PCT Pub. No.: WO2022/054429
PCT Pub. Date: Mar. 17, 2022

(65) Prior Publication Data

US 2023/0268222 A1 Aug. 24, 2023

(30) Foreign Application Priority Data

Sep. 11, 2020 (JP) ................................ 2020-152637

(51) Int. Cl.
*H01L 21/762* (2006.01)
*C23C 16/40* (2006.01)
(Continued)

(52) U.S. Cl.
CPC ........ *H10P 90/1914* (2026.01); *C23C 16/401* (2013.01); *C23C 16/56* (2013.01); *H10W 10/181* (2026.01)

(58) Field of Classification Search
CPC ......... H01L 21/76251; H01L 21/02002; H01L 21/225; H01L 21/76254; H01L 21/7624;
(Continued)

(56) References Cited

U.S. PATENT DOCUMENTS

| | | | |
|---|---|---|---|
| 5,753,353 | A | 5/1998 | Kikuchi |
| 6,008,110 | A | 12/1999 | Samata et al. |

(Continued)

FOREIGN PATENT DOCUMENTS

| | | | |
|---|---|---|---|
| CN | 101681805 A | 3/2010 |
| EP | 0710980 A2 | 5/1996 |

(Continued)

OTHER PUBLICATIONS

Oct. 29, 2024 Office Action issued in Taiwanese Patent Application No. 110129207.

(Continued)

*Primary Examiner* — Dale E Page
*Assistant Examiner* — Quovaunda Jefferson
(74) *Attorney, Agent, or Firm* — Oliff PLC

(57) ABSTRACT

A method for manufacturing an SOI wafer including: a step of forming a silicon oxide film by thermal oxidation on an entire surface of a base wafer containing a dopant; and bonding a main surface of a bond wafer to a first main surface via the silicon oxide film, wherein, prior to the thermal oxidation step, a step of forming a CVD insulator film on a second main surface; and a step of forming, on the first main surface, a barrier silicon layer containing a dopant at a lower concentration than a dopant concentration of the base wafer, and in the thermal oxidation step, the barrier silicon layer is thermally oxidized to produce a barrier silicon oxide film, and in the bonding step, the bond wafer is bonded to the base wafer via the barrier silicon oxide film as a part of the silicon oxide film.

19 Claims, 4 Drawing Sheets

(51) Int. Cl.
*C23C 16/56* (2006.01)
*H10P 90/00* (2026.01)
*H10W 10/10* (2026.01)

(58) Field of Classification Search
CPC ......... H01L 21/02381; H01L 21/02532; C23C 16/401; C23C 16/56; H10P 90/00; H10P 90/1914; H10P 90/1916; H10P 90/1906; H10P 32/14; H10P 14/2905; H10P 14/3411; H10W 10/181
See application file for complete search history.

(56) References Cited

U.S. PATENT DOCUMENTS

| | | | | |
|---|---|---|---|---|
| 6,214,702 | B1 | 4/2001 | Kim | |
| 7,985,660 | B2 | 7/2011 | Yokokawa et al. | |
| 11,127,624 | B2 | 9/2021 | Schwarzenbach et al. | |
| 2003/0232466 | A1 | 12/2003 | Zistl et al. | |
| 2010/0001322 | A1* | 1/2010 | Euen | H01L 21/76254 257/213 |
| 2010/0112781 | A1 | 5/2010 | Yokokawa et al. | |
| 2014/0084290 | A1 | 3/2014 | Allibert et al. | |
| 2019/0221470 | A1 | 7/2019 | Kobayashi et al. | |

FOREIGN PATENT DOCUMENTS

| | | | |
|---|---|---|---|
| EP | 2149898 | A1 | 2/2010 |
| JP | H05-226620 | A | 9/1993 |
| JP | H08-037286 | A | 2/1996 |
| JP | H08-139295 | A | 5/1996 |
| JP | 2008-244019 | A | 10/2008 |
| JP | 2008-294045 | A | 12/2008 |
| JP | 2020-511777 | A | 4/2020 |
| KR | 2010-0017106 | A | 2/2010 |
| TW | 201810628 | A | 3/2018 |
| WO | 2008/0146441 | A1 | 12/2008 |

OTHER PUBLICATIONS

Sep. 21, 2021 International Search Report issued in International Patent Application No. PCT/JP2021/027635.

Mar. 7, 2023 International Preliminary Report on Patentability issued in International Patent Application No. PCT/JP2021/027635.

Mar. 18, 2025 Extended European Search Report issued in European Patent Application No. 21866389.6.

Dec. 5, 2025 Office Action issued in Korean Patent Application No. 10-2023-7008165.

Apr. 10, 2026 Office Action issued in Singaporean Patent Application No. 11202301596R.

* cited by examiner

[FIG. 1]
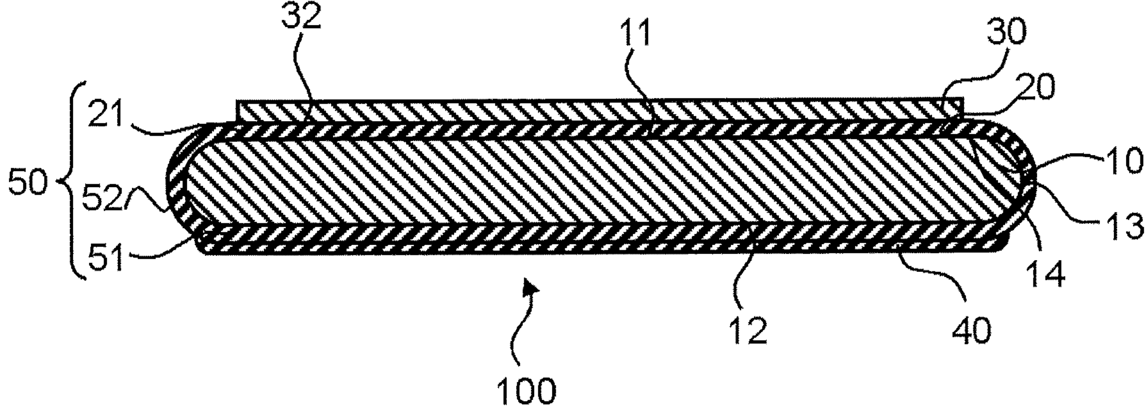
[FIG. 2]
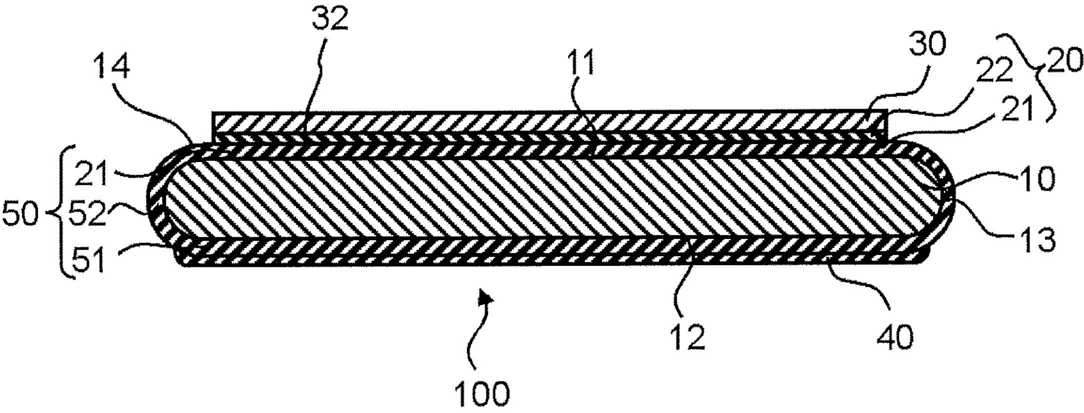
[FIG. 3]
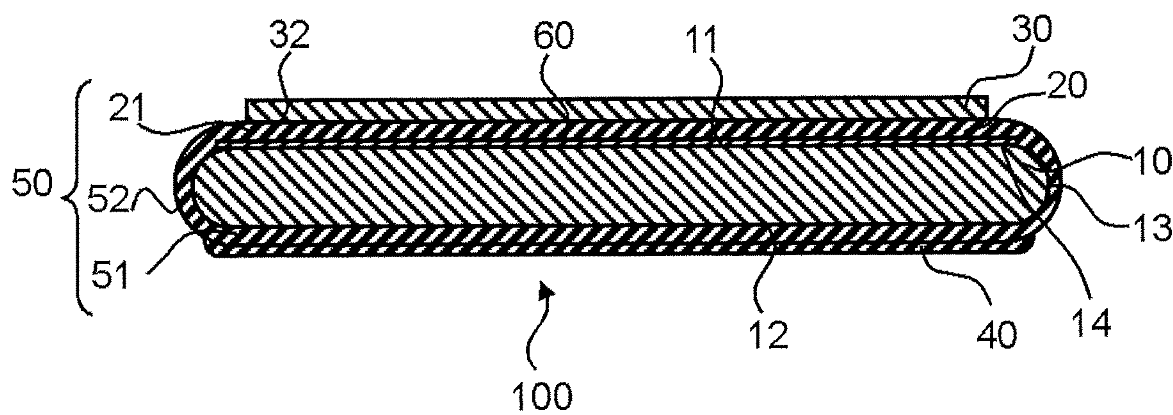

[FIG. 4]
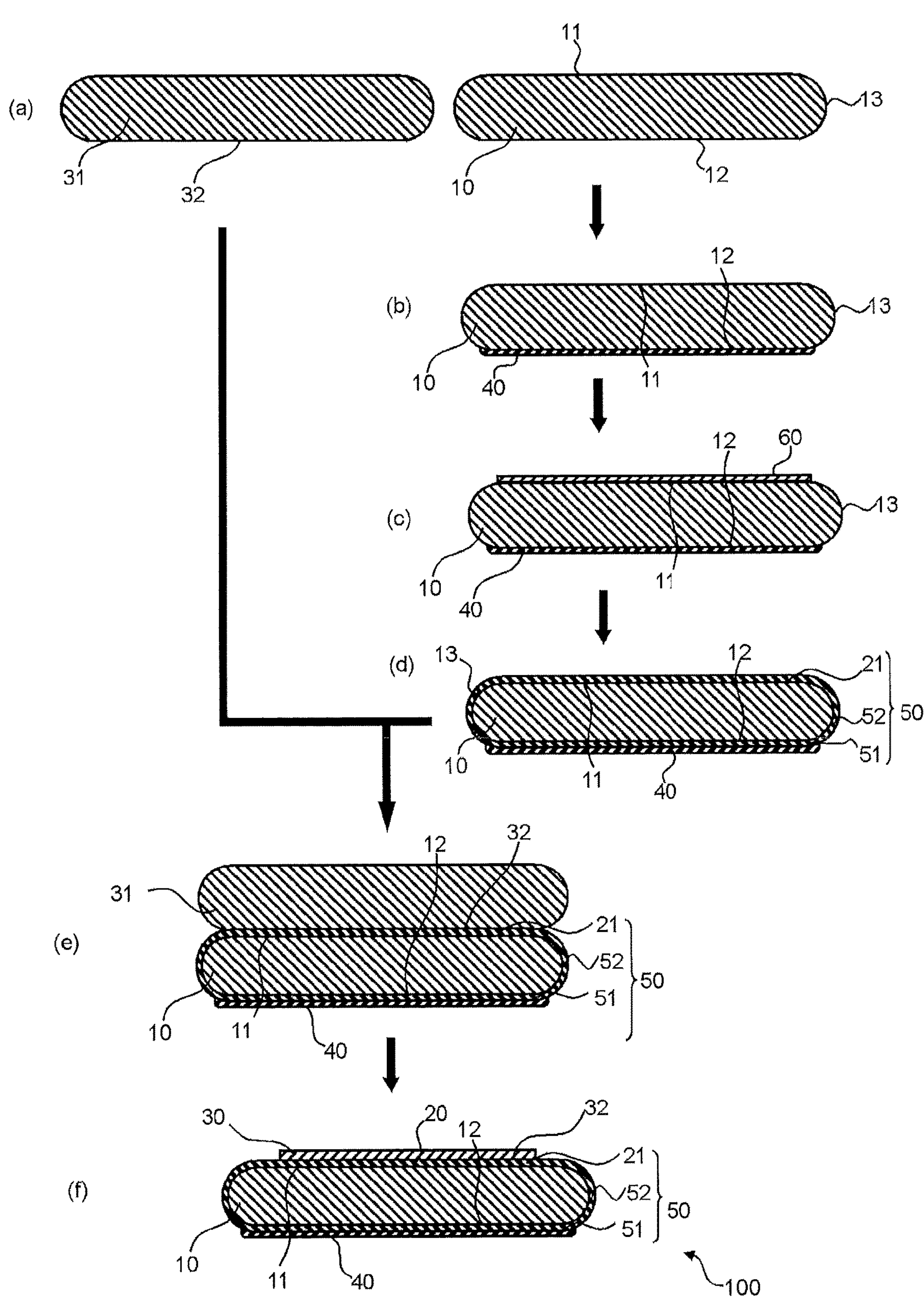

[FIG. 5]
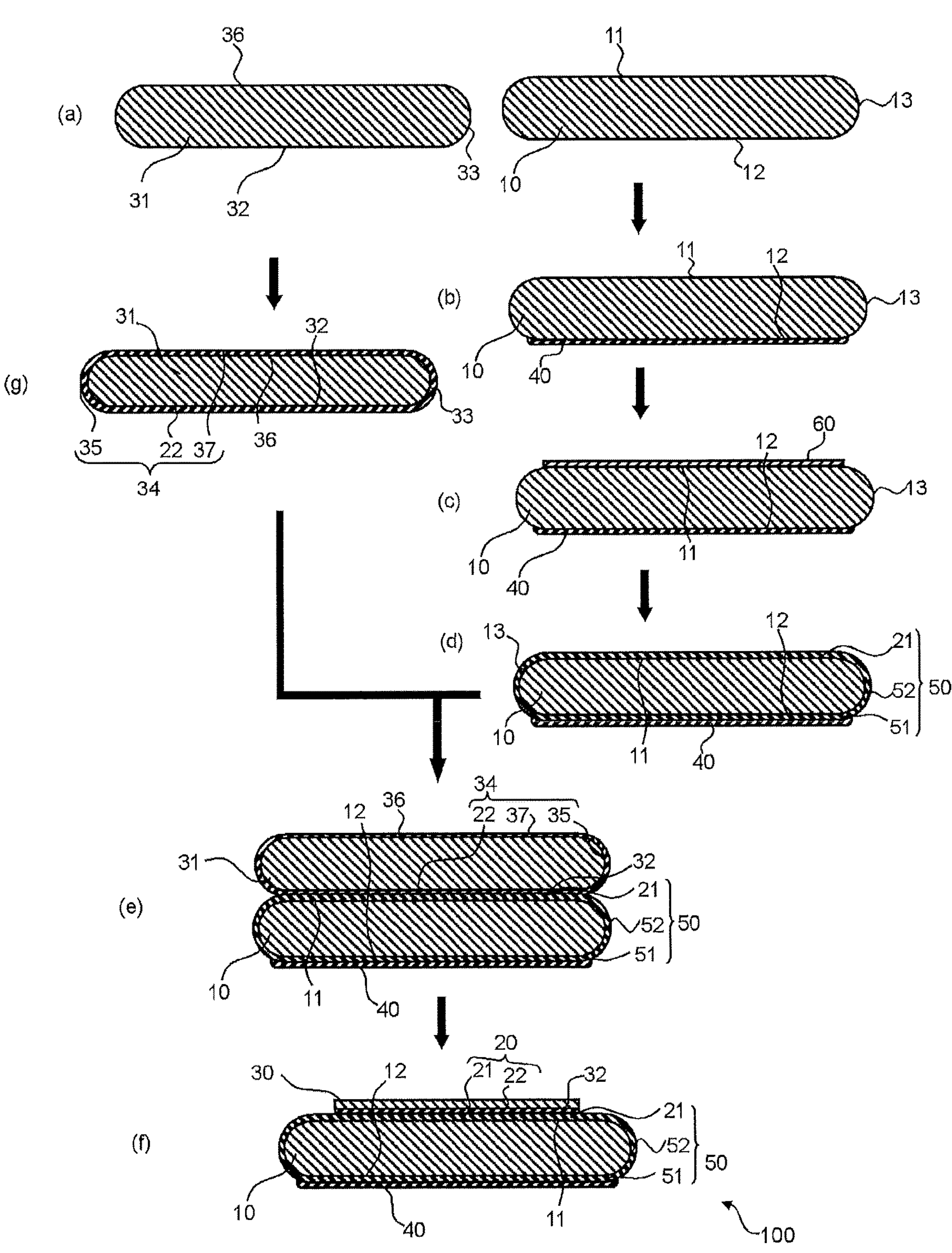

[FIG. 6]
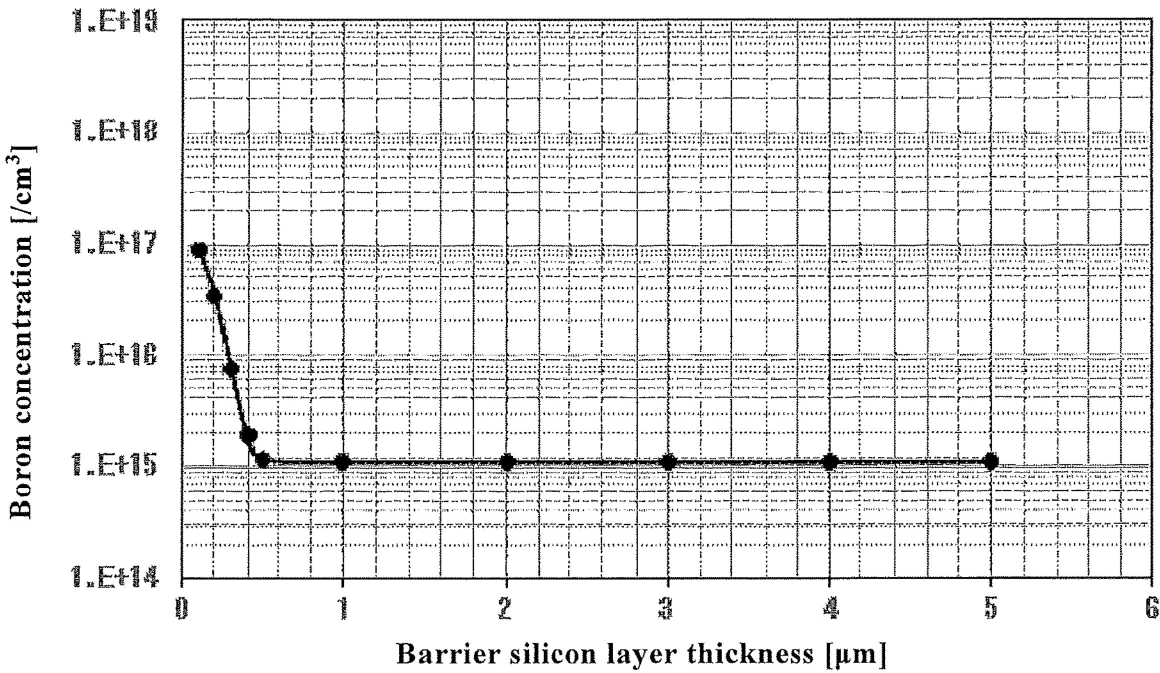
[FIG. 7]
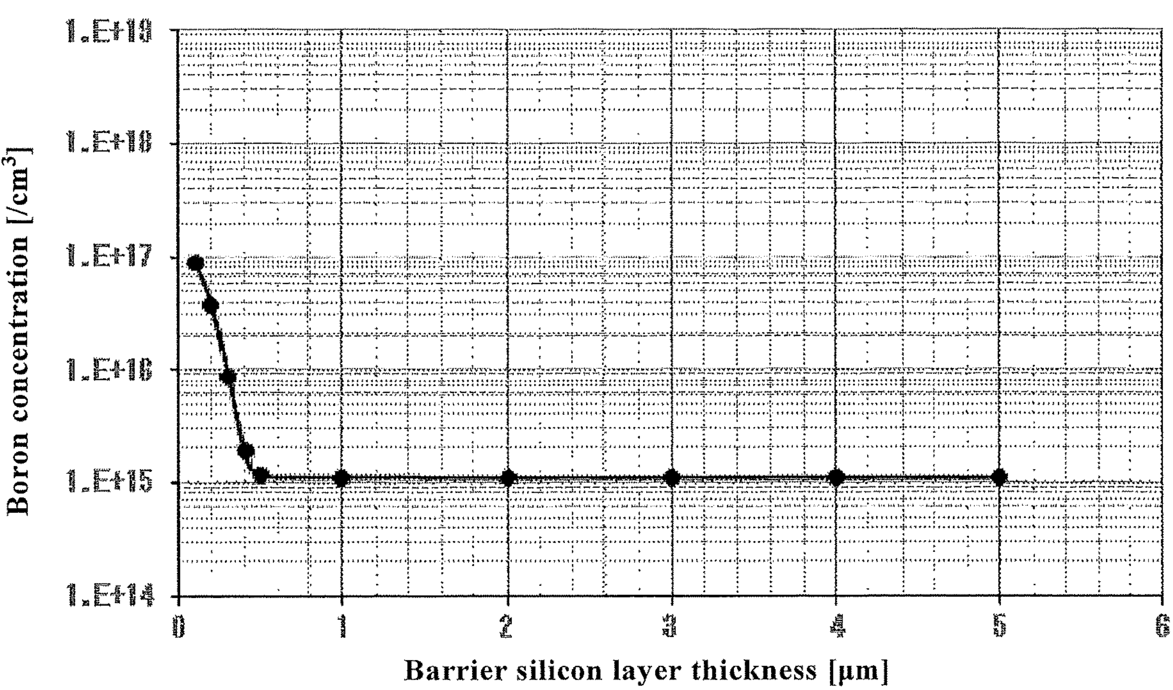

METHOD FOR MANUFACTURING SOI WAFER AND SOI WAFER

TECHNICAL FIELD

The present invention relates to a method for manufacturing an SOI wafer and an SOI wafer.

BACKGROUND ART

One of wafers for semiconductor devices is a silicon on insulator (SOI) wafer, which has a silicon layer (which may be referred to hereinafter as an SOI layer) formed on a silicon oxide film as an insulator film. This SOI wafer has characteristics such as small parasitic capacitance and high radiation resistance because the SOI layer in a substrate surface layer portion, which serves as a device fabrication region, is electrically isolated from the interior of the substrate by a buried insulator layer (buried oxide film (BOX layer)). For this reason, SOI wafers are expected to provide effects of realizing fast and low-power consuming operations and preventing software errors, holding promise as substrates for high performance semiconductor devices.

Typical methods for manufacturing an SOI wafer include a wafer bonding method and a SIMOX method. For example, the wafer bonding method manufactures an SOI wafer as follows: a thermal oxide film is formed on a surface of at least one of two silicon single crystal wafers, the two wafers are sealed together via the formed thermal oxide film, and bonding heat treatment is applied to increase the bond, followed by thinning one of the wafers (the wafer on which an SOI layer is to be formed (hereinafter referred to as a bond wafer)) by mirror polishing or the like. Methods for the thinning include a method of grinding and polishing the bond wafer to a desired thickness and a method called an ion implantation delamination method, which implants hydrogen or at least one kind of rare gas ions into the bond wafer to form an ion implanted layer in advance and delaminates the bond wafer by using the formed ion implanted layer used as a delaminating plane to thereby produce a thinned SOI layer.

The SIMOX method is a method in which oxygen ions implanted into a single crystal silicon substrate and high-temperature heat treatment (oxide film-forming heat treatment) is performed to react the implanted oxygen with silicon to form a BOX layer and thus manufacture an SOI substrate.

Of these two typical techniques, the wafer bonding method is available for various device applications because the method advantageously allows for tailoring thicknesses of the SOI layer and the BOX layer to be fabricated.

The ion implantation delamination method, among others, has recently been increasingly used because it can provide extremely excellent thickness uniformity of the SOI layer to be fabricated.

Meanwhile, frequently, SOI wafers are manufactured using base wafers heavily-doped with boron in order to suppress warpage of the SOI wafer and increase gettering capability, as disclosed in Patent Documents 1 and 2.

When such heavily-boron-doped base wafers are used in the ion implantation delamination method, those formed with a buried insulator layer that is as thick as 2 μm or more may be required, for example. In such cases, attempts to perform bonding by forming a thick oxide film on the bond wafer will suffer from the need for extremely large energy for ion implantation or increased warpage of the fabricated SOI wafer. Accordingly, a thick oxide film should be formed on the base wafer for bonding the base wafer to the bond wafer.

Such a thick oxide film is formed by thermal oxidation of the heavily boron doped base wafer, which results in a high quantity of boron being contained in the thermal oxide film. This gives rise to a problem that boron contained in the thermal oxide film on the back side of the SOI wafer is diffused outward to contaminate the SOI layer with the dopant (so-called autodoping) when bonding heat treatment, flattening heat treatment, or high-temperature heat treatment such as epitaxial growth is applied to the SOI wafer after the thinning by the ion implantation delamination method. Occurrence of such autodoping will change the conductivity type and resistivity of the SOI layer.

Even when other film-thinning techniques such as grinding and polishing is used, similar problems occur during heat treatment to thicken the SOI layer through epitaxial growth on the SOI layer after the thinning or during heat treatment in a device manufacture process using the SOI wafer.

To address such problems, the present inventors proposed, in Patent Document 3, a method to suppress both of the dopant contamination of the SOI layer and warpage by forming a CVD insulator film on a surface of the base wafer opposite its bonding surface prior to a thermal oxidation step for the base wafer.

However, it has been found that even the use of this method may not always sufficiently suppress the dopant contamination of the SOI layer.

CITATION LIST

Patent Literature

Patent Document 1: JP H05-226620 A
Patent Document 2: JP H08-037286 A
Patent Document 3: JP 2008-294045 A

SUMMARY OF INVENTION

Technical Problem

Earnest studies by the present inventor on possible causes of the above problems with the method disclosed in Patent document 3 have revealed that, while dopant contamination of the SOI layer primarily originates from outward diffusion from the backside oxide film of the base wafer, solid phase diffusion from the buried oxide film in the SOI wafer, besides the outward diffusion, also contributes to the occurrence of the dopant contamination.

The present invention has been made in view of the above problems. An object of the present invention is to provide a method for manufacturing an SOI wafer that can manufacture an SOI wafer while suppressing any contamination of the SOI layer caused by incorporation of the dopant contained in the base wafer, as well as an SOI wafer that can suppress any contamination of the SOI layer caused by incorporation of the dopant contained in the base wafer.

Solution to Problem

To achieve the above object, the present invention provides a method for manufacturing an SOI wafer, at least comprising:

a step of providing a base wafer and a bond wafer, the base wafer comprising a silicon single crystal wafer containing a dopant across the wafer and having a first main surface and a second main surface opposite the first main surface, the bond wafer comprising a silicon single crystal wafer containing a dopant at a lower concentration than a dopant concentration of the base wafer;

a thermal oxidation step of forming a silicon oxide film on an entire surface of the base wafer by thermal oxidation;

a bonding step of bonding one main surface of the bond wafer to the first main surface of the base wafer via the silicon oxide film on the base wafer; and a thinning step of thinning the bond wafer to form an SOI layer, wherein the method further comprises, prior to the thermal oxidation step for the base wafer:

a step of forming a CVD insulator film on the second main surface of the base wafer; and a step of forming a barrier silicon layer on the first main surface of the base wafer, the barrier silicon layer containing a dopant at a lower concentration than the dopant concentration of the base wafer, wherein in the thermal oxidation step, the barrier silicon layer is thermally oxidized to produce a barrier silicon oxide film as a part of the silicon oxide film, and in the bonding step, the one main surface of the bond wafer is bonded to the first main surface of the base wafer via the barrier silicon oxide film as a part of the silicon oxide film.

Such an inventive method for manufacturing an SOI wafer can produce, in the bonding step, an SOI wafer having a CVD insulator film formed on the second main surface of the base wafer opposite its bonding surface (first main surface) for bonding to the bond wafer, and the first main surface of the base wafer is bonded to the one main surface of the bond wafer via the barrier silicon oxide film. The barrier silicon oxide film contains a dopant at a lower concentration than the dopant concentration of the base wafer. Such an SOI wafer can not only block autodoping from the second main surface of the base wafer into the bond wafer by virtue of the CVD insulator film, but also it can suppress autodoping caused by solid phase diffusion from the first main surface of the base wafer into the bond wafer because the barrier silicon oxide film can serve as a dopant-diffusion prevention layer. Additionally, since the silicon oxide film is formed on the entire surface of the base wafer by thermal oxidation during the thermal oxidation step for the base wafer, suppressed can be also outward diffusion of the dopant from the terrace and edge portions of the base wafer by this silicon oxide film.

Thus, the inventive method for manufacturing an SOI wafer can suppress incorporation of the dopant contained in the base wafer into the bond wafer or the SOI layer caused by outward diffusion through the silicon oxide film on the backside, second main surface of the base wafer, or into the bond wafer or the SOI layer caused by solid phase diffusion through the silicon oxide film between the base wafer and the bond wafer or the SOI layer, during, for example, the bonding step and its subsequent steps. In particular, the inventive method can suppress such dopant incorporation into the SOI layer even during the steps involving heat treatment.

That is, the inventive method for manufacturing an SOI wafer can manufacture an SOI wafer while suppressing contamination of the SOI layer due to incorporation of the dopant contained in the base wafer. With this capability of preventing autodoping, the inventive method can prevent changes in the conductivity type or resistivity of the SOI layer.

Further, even when devices are manufactured by using SOI wafers manufactured according to the inventive method for manufacturing an SOI wafer, it is also possible to suppress incorporation of the dopant contained in the base wafer into the SOI layer caused by outward diffusion through the silicon oxide film on the backside, second main surface of the base wafer, or into the SOI layer caused by solid phase diffusion from the silicon oxide film as the buried oxide film of the SOI wafer.

Additionally, when devices are manufactured by using SOI wafers manufactured according to the inventive method for manufacturing an SOI wafer, outward diffusion of the dopant through the second main surface of the base wafer can be suppressed, so that it is possible to sufficiently suppress dopant contamination to furnace components of a heat treatment furnace, and to obtain the effect of suppressing secondary contamination from the furnace components to the wafer.

Further, according to the inventive method for manufacturing SOI wafer, by using a dopant-containing base wafer, manufactured can be an SOI wafer that can suppress warpage and provide an excellent gettering effect.

The inventive method may further comprise a step of forming a silicon oxide film on an entire surface of the bond wafer prior to the bonding step.

With the silicon oxide film formed on the entire surface of the bond wafer in this manner, the base wafer can be bonded to the bond wafer in the bonding step via the silicon oxide film disposed on the first main surface of the base wafer and the silicon oxide film disposed on the bond wafer. Performing the bonding step in this manner can more reliably suppress incorporation of the dopant into the bond wafer or the SOI layer from the first main surface of the base wafer.

Alternatively, in the bonding step, a silicon single crystal surface in the one main surface of the bond wafer may be directly bonded to a surface of the barrier silicon oxide film of the base wafer.

Even without the formation of the silicon oxide film on the bond wafer, incorporation of the dopant into the SOI layer caused by solid phase diffusion through the silicon oxide film disposed on the first main surface of the base wafer can be sufficiently suppressed. This embodiment is especially advantageous in situations when bonding of oxide films with each other is not available (e.g., when high-temperature heat treatment (e.g., 1150° C. or more) is not available in the bonding step).

The inventive method may further comprise, prior to the bonding step, an ion implantation step of implanting at least one kind of ions selected from a group consisting of hydrogen ion and rare gas ions into the bond wafer to form an ion implanted layer, wherein in the thinning step, the bond wafer may be delaminated with the ion implanted layer used as a delaminating plane to thereby thin the bond wafer to produce the SOI layer.

By performing the ion implantation step to form such an ion implanted layer and utilizing this ion implanted layer in the thinning step, a thinned SOI layer with excellent film thickness uniformity can be produced.

For example, in the step of forming the CVD insulator film, it is preferred to form any one of a CVD oxide film, a CVD nitride film, and a CVD oxynitride film as the CVD insulator film.

These films are not only easy to form, but also can be dense CVD insulator films. Thus, outward diffusion of the dopant through the second main surface of the base wafer opposite its first main surface can be more reliably suppressed.

A wafer with the dopant concentration of $1\times10^{17}$ atoms/cm$^3$ or more may be provided as the base wafer.

According to the inventive method for manufacturing an SOI wafer, even with the use of the base wafer with the dopant concentration of $1\times10^{17}$ atoms/cm$^3$ or more, an SOI wafer can be manufactured while suppressing contamination of the SOI layer caused by incorporation of the dopant contained in the base wafer.

It is preferred to form a layer with a dopant concentration of $1\times10^{16}$ atoms/cm$^3$ or less as the barrier silicon layer.

Forming such a barrier silicon layer can more reliably suppress incorporation of the dopant into the SOI layer caused by solid phase diffusion through the silicon oxide film disposed on the first main surface of the base wafer.

In the thermal oxidation step, thermal oxidation may be performed such that a part of the barrier silicon layer remains unoxidized, and annealing may be subsequently applied to diffuse the dopant in the base wafer into a layer of the unoxidized part of the barrier silicon layer.

In this manner, thermal oxidation may be performed in the thermal oxidation step such that only a part but not all of the barrier silicon layer is turned into the barrier silicon oxide film with another part of the barrier silicon layer left unoxidized. In such cases, annealing may be applied to diffuse the dopant into a layer of the unoxidized part of the barrier silicon layer.

Also, the present invention provides an SOI wafer comprising:

- a base wafer;
- a buried oxide film; and
- an SOI layer boned to the base wafer via the buried oxide film, wherein
- the base wafer comprises a silicon single crystal wafer containing a dopant across the wafer and having a first main surface and a second main surface opposite the first main surface, the first main surface being a bonding surface for bonding to the SOI layer,
- a barrier silicon oxide film as at least a part of the buried oxide film is disposed on the first main surface of the base wafer,
- a backside silicon oxide film is disposed on the second main surface of the base wafer,
- a CVD insulator film is disposed on a surface of the backside silicon oxide film facing away from the base wafer,
- the SOI layer comprises a silicon single crystal containing a dopant at a lower concentration than a dopant concentration of the base wafer, and
- a concentration of a dopant in the barrier silicon oxide film is lower than a concentration of a dopant in the backside silicon oxide film.

The inventive SOI wafer includes a barrier silicon oxide film on a first main surface, a bonding surface, of the base wafer, and a dopant concentration in the barrier silicon oxide film is lower than that in the backside silicon oxide film. Such a barrier silicon oxide film can prevent incorporation of the dopant from the base wafer into the SOI layer caused by solid phase diffusion through the buried oxide film. Additionally, the backside silicon oxide film and the CVD insulator film can prevent outward diffusion of the dopant through the second main surface of the base wafer opposite its first main surface. As a result, the inventive SOI wafer can suppress contamination of the SOI layer caused by incorporation of the dopant contained in the base wafer.

Further, even when devices are manufactured using the inventive SOI wafer, it is possible to suppress incorporation of the dopant contained in the base wafer into the SOI layer by outward diffusion through the second main surface, or into the SOI layer by solid phase diffusion in the buried oxide film.

Additionally, when devices are manufactured using the inventive SOI wafer, outward diffusion of the dopant through the second main surface of the base wafer can be suppressed, so that it is possible to sufficiently suppress dopant contamination to furnace components of a heat treatment furnace, and the effect of suppressing secondary contamination from the furnace components to the wafer can be attained.

Furthermore, the inventive SOI wafer includes a dopant-containing base wafer, so that it can suppress warpage and provide an excellent gettering effect.

A barrier silicon layer may be disposed between the base wafer and the barrier silicon oxide film, and a dopant of a same kind as the dopant contained in the base wafer may be diffused in the barrier silicon layer.

Thus, the inventive SOI wafer can further include a barrier silicon layer between the base wafer and the barrier silicon oxide film.

Advantageous Effects of Invention

As described above, the inventive method for manufacturing an SOI wafer can manufacture an SOI wafer while suppressing contamination of the SOI layer caused by incorporation of the dopant contained in the base wafer. With this capability of preventing autodoping, changes in the conductivity type or resistivity of the SOI layer can be prevented.

Further, using SOI wafers manufactured according to the inventive method for manufacturing an SOI wafer for device manufacture can suppress incorporation of the dopant contained in the base wafer into the SOI layer.

Furthermore, SOI wafers manufactured according to the inventive method for manufacturing an SOI wafer can suppress warpage and provide an excellent gettering effect.

Also, the inventive SOI wafer can suppress contamination of the SOI layer caused by incorporation of the dopant contained in the base wafer.

Further, during a device manufacture process using the inventive SOI wafer, contamination of the SOI layer caused by incorporation of the dopant contained in the base wafer can be suppressed.

Furthermore, the inventive SOI wafer can suppress warpage and provide an excellent gettering effect.

BRIEF DESCRIPTION OF DRAWINGS

FIG. 1 is a schematic cross-sectional view showing a first example of the inventive SOI wafer;

FIG. 2 is a schematic cross-sectional view showing a second example of the inventive SOI wafer;

FIG. 3 is a schematic cross-sectional view showing a third example of the inventive SOI wafer;

FIG. 4 is a schematic flowchart showing a first example of the inventive method for manufacturing an SOI wafer;

FIG. 5 is a schematic flowchart showing a second example of the inventive method for manufacturing an SOI wafer;

FIG. 6 is a graph showing simulation results in Example 4; and

FIG. 7 is a graph showing simulation results in Example 5.

DESCRIPTION OF EMBODIMENTS

As described above, a need has existed for development of a method for manufacturing an SOI wafer that can manufacture an SOI wafer while suppressing any contamination of the SOI layer caused by incorporation of the dopant contained in the base wafer, as well as an SOI wafer that can suppress any contamination of the SOI layer caused by incorporation of the dopant contained in the base wafer.

The present inventor has earnestly studied to achieve the above object and consequently found that it is possible to manufacture an SOI wafer while suppressing any contamination of the SOI layer caused by incorporation of the dopant contained in the base wafer by, prior to a thermal oxidation step for the base wafer, forming a CVD insulator film on a second main surface of the base wafer opposite its bonding surface, forming a barrier silicon layer on a first main surface, which is the bonding surface, of the base wafer, where the barrier silicon layer contains a dopant at a lower concentration than the dopant concentration of the base wafer, and then performing the thermal oxidation step for the base wafer and subsequently bonding the base wafer to the bond wafer. The present inventor completed the present invention based on this finding.

That is, the present invention is a method for manufacturing an SOI wafer, at least comprising:

a step of providing a base wafer and a bond wafer, the base wafer comprising a silicon single crystal wafer containing a dopant across the wafer and having a first main surface and a second main surface opposite the first main surface, the bond wafer comprising a silicon single crystal wafer containing a dopant at a lower concentration than a dopant concentration of the base wafer;

a thermal oxidation step of forming a silicon oxide film on an entire surface of the base wafer by thermal oxidation;

a bonding step of bonding one main surface of the bond wafer to the first main surface of the base wafer via the silicon oxide film on the base wafer; and a thinning step of thinning the bond wafer to form an SOI layer, wherein the method further comprises, prior to the thermal oxidation step for the base wafer:

a step of forming a CVD insulator film on the second main surface of the base wafer; and a step of forming a barrier silicon layer on the first main surface of the base wafer, the barrier silicon layer containing a dopant at a lower concentration than the dopant concentration of the base wafer, wherein in the thermal oxidation step, the barrier silicon layer is thermally oxidized to produce a barrier silicon oxide film as a part of the silicon oxide film, and in the bonding step, the one main surface of the bond wafer is bonded to the first main surface of the base wafer via the barrier silicon oxide film as a part of the silicon oxide film.

Also, the present invention is an SOI wafer comprising:

a base wafer;

a buried oxide film; and an SOI layer boned to the base wafer via the buried oxide film, wherein the base wafer comprises a silicon single crystal wafer containing a dopant across the wafer and having a first main surface and a second main surface opposite the first main surface, the first main surface being a bonding surface for bonding to the SOI layer, a barrier silicon oxide film as at least a part of the buried oxide film is disposed on the first main surface of the base wafer, a backside silicon oxide film is disposed on the second main surface of the base wafer, a CVD insulator film is disposed on a surface of the backside silicon oxide film facing away from the base wafer, the SOI layer comprises a silicon single crystal containing a dopant at a lower concentration than a dopant concentration of the base wafer, and a concentration of a dopant in the barrier silicon oxide film is lower than a concentration of a dopant in the backside silicon oxide film.

Hereinafter, the present invention will be described in detail with reference to the drawings, but the present invention is not limited to the following description.

<SOI Wafer>

First, the SOI wafer of the present invention will be described.

The inventive SOI wafer is characterized in that it includes a barrier silicon oxide film on a first main surface, a bonding surface, of a base wafer, that a backside silicon oxide film and a CVD insulator film are disposed on a second main surface of the base wafer opposite the first main surface, and that a dopant concentration in the barrier silicon oxide film is lower than that in the backside silicon oxide film. Such a barrier silicon oxide film can prevent incorporation of the dopant from the base wafer into the SOI layer caused by solid phase diffusion through the buried oxide film. Additionally, the backside silicon oxide film and the CVD insulator film can prevent outward diffusion of the dopant through the second main surface of the base wafer opposite its first main surface. As a result, the inventive SOI wafer can suppress contamination of the SOI layer caused by incorporation of the dopant contained in the base wafer.

Further, even when devices are manufactured by using the inventive SOI wafer, it is possible to suppress incorporation of the dopant contained in the base wafer into the SOI layer by outward diffusion through the second main surface, or into the SOI layer by solid phase diffusion in the buried oxide film.

Additionally, when devices are manufactured by using the inventive SOI wafer, outward diffusion of the dopant through the second main surface of the base wafer can be suppressed, so that it is possible to sufficiently suppress dopant contamination to furnace components of a heat treatment furnace, and the effect of suppressing secondary contamination from the furnace components to the wafer can be also attained.

In the inventive SOI wafer, a barrier silicon layer may be disposed between the base wafer and the barrier silicon oxide film. In such cases, a dopant of the same kind as the dopant contained in the base wafer may be diffused in the barrier silicon layer.

Thus, the inventive SOI wafer can further include a barrier silicon layer between the base wafer and the barrier silicon oxide film. The inventive SOI wafer can also include other layers.

The inventive SOI can be manufactured by, for example, the inventive method for manufacturing an SOI layer, which will be described latter.

Hereafter, components of the inventive SOI wafer will be detailed.

(Base Wafer)

The base wafer comprises a silicon single crystal wafer containing a dopant across the wafer. Examples of the dopant can include B, Ga, P, Sb, As etc. Such a silicon single crystal wafer can be produced by, for example, slicing a silicon single crystal ingot manufactured according to a CZ method or an FZ method.

The dopant concentration of the base wafer is not particularly limited provided that it is higher than the dopant concentration of the SOI layer, and can be $1\times10^{17}$ atoms/$cm^3$ or more, for example. By using the base wafer with the dopant concentration of $1\times10^{17}$ atoms/$cm^3$ or more, an excellent gettering effect can be exhibited and warpage of the SOI wafer can be more greatly suppressed. Additionally, for the reasons mentioned earlier, the inventive SOI wafer can suppress incorporation of the dopant contained in the base wafer into the SOI layer even with the use of the base wafer with the dopant concentration therein of $1\times10^{17}$ atoms/$cm^3$ or more.

Should be noted that, in cases where the dopant in the base wafer is an n-type dopant, the dopant concentration taken into the silicon oxide film during formation thereof on the base wafer by thermal oxidation is lower than when the dopant is a p-type dopant, so that the problem of dopant contamination of the SOI layer as mentioned earlier will not be so significant. However, even in the case of an n-type dopant, the dopant concentration as high as $1\times10^{17}$ atoms/$cm^3$ or more in the base wafer does make the problem of dopant contamination on the SOI layer non-negligible. However, as mentioned above, the inventive SOI wafer can suppress incorporation of the dopant contained in the base wafer into the SOI layer even when the base wafer has such a high dopant concentration.

The upper limit for the dopant concentration of the base wafer is not particularly limited, and can be at or below the solid solubility limit of that dopant in the silicon single crystal. The dopant concentration of the base wafer is preferably $1\times10^{17}$ atoms/$cm^3$ or more and $1\times10^{20}$ atoms/$cm^3$ or less.

A barrier silicon oxide film is disposed on the first main surface of the base wafer, which is the bonding surface for bonding to the SOI layer. Also, a backside silicon oxide film is disposed on the second main surface opposite the first main surface. Optionally, a side silicon oxide film may be disposed on a side surface of the base wafer. With the side silicon oxide film disposed, the barrier silicon oxide film, the backside silicon oxide film, and the side silicon oxide film can constitute a silicon oxide film formed on the entire surfaces of the base wafer.

A concentration of a dopant in the barrier silicon oxide film is lower than a concentration of a dopant in the backside silicon oxide film. The concentration of the dopant in the backside silicon oxide film can be lower than the dopant concentration of the base wafer.

The base wafer can include a portion of the first main surface on which the SOI layer is not formed, i.e., a terrace portion. The barrier silicon oxide film can also be disposed on the terrace portion of the first main surface of the base wafer. In such cases, the barrier silicon oxide film can block outward diffusion of the dopant through the terrace portion of the first main surface of the base wafer.

(SOI Layer)

The SOI layer comprises a silicon single crystal containing a dopant at a lower concentration than the dopant concentration of the base wafer.

Examples of the dopant can include B, Ga, P, Sb, As etc. The SOI layer may contain a dopant of the same kind as, or of a different kind from, the dopant contained in the base wafer.

The dopant concentration of the SOI layer is not particularly limited provided that it is lower than the dopant concentration of the base wafer, and can be modified as appropriate according to the conductivity type and resistivity required for the SOI layer. The dopant concentration of the SOI layer can be, for example, $1\times10^{13}$ atoms/$cm^3$ or more and $1\times10^{16}$ atoms/$cm^3$ or less.

The SOI layer can also include portions devoid of the dopant.

A silicon oxide film (hereinafter also referred to as an SOI-side silicon oxide film) may be disposed on one main surface of the SOI layer, which is a bonding surface for bonding to the base wafer.

(Buried Oxide Film)

The buried oxide film is disposed between the base wafer and the SOI layer.

The buried oxide film includes, at least as a part thereof, the barrier silicon oxide film described above.

The buried oxide film may consist of the barrier silicon oxide film. In such cases, the silicon single crystal surface of the SOI layer may be directly bonded to the surface of the barrier silicon oxide film of the base wafer in the SOI wafer.

Alternatively, the buried oxide film may include the barrier silicon oxide film and a different oxide film. For example, when the SOI-side silicon oxide film is disposed on the one main surface of the SOI layer, which is the bonding surface for bonding to the base wafer, this SOI-side silicon oxide film may be a part of the buried oxide film. In such cases, the barrier silicon oxide film may be directly bonded to the SOI-side silicon oxide film in the SOI wafer.

(CVD Insulator Film)

Preferable examples of the CVD insulator film may include, but not limited to, a CVD oxide film, a CVD nitride film, and a CVD oxynitride film.

These films are not only easy to form, but also can be dense CVD insulator films. Thus, these films can more reliably suppress outward diffusion of the dopant through the second main surface of the base wafer opposite its first main surface.

Some specific examples of the inventive SOI wafer are now described with reference to FIGS. 1-3. However, the inventive SOI wafer is not limited to the examples below. In the following, only the arrangement of the components will be described; for details of each component, see the above description.

First Example

FIG. 1 is a schematic cross-sectional view showing a first example of the inventive SOI wafer.

The first example SOI wafer 100 shown in FIG. 1 includes a base wafer 10, a buried oxide film 20, and an SOI layer 30 bonded to the base wafer 10 via the buried oxide film 20.

The base wafer 10 includes a first main surface 11, which is a bonding surface for bonding to the SOI layer 30, and a second main surface 12 opposite the first main surface 11.

A barrier silicon oxide film 21 is disposed on the first main surface 11 of the base wafer 10. In the SOI wafer 100 of the first example shown in FIG. 1, the buried oxide film 20 consists of a barrier silicon oxide film 21. Should be noted that, in the SOI wafer 100 of the first example shown in FIG. 1, the barrier silicon oxide film 21 is also formed on a portion of the first main surface 11 of the base wafer 10 that does not have the SOI layer 30 thereon, i.e., a terrace portion 14. On the other hand, a backside silicon oxide film 51 is disposed on the second main surface 12 of the base wafer 10. Additionally, a side silicon oxide film 52 is disposed on a side surface (edge portion) of the base wafer 10.

In other words, in the SOI wafer 100 of the first example shown in FIG. 1, entire surfaces of the base wafer 10 are covered with the silicon oxide film 50 including the barrier silicon oxide film 21, the backside silicon oxide film 51, and the side silicon oxide film 52.

Also, in the SOI wafer 100 of the first example shown in FIG. 1, a CVD insulator film 40 is disposed on a surface of the backside silicon oxide film 51 facing away from the base wafer 10.

Furthermore, in the SOI wafer 100 of the first example shown in FIG. 1, one main surface 32 of the SOI layer 30 is directly bonded to the surface of the barrier silicon oxide film 21, namely the buried oxide film 20.

Second Example

FIG. 2 is a schematic cross-sectional view showing a second example of the inventive SOI wafer.

The SOI wafer 100 of the second example shown in FIG. 2 is similar to the first example SOI wafer 100, except that a silicon oxide film (SOI-side silicon oxide film) 22 is formed on a portion of the surface of the SOI layer 30.

Specifically, as shown in FIG. 2, the SOI-side silicon oxide film 22 is disposed on one main surface 32 of the SOI layer 30, which is a bonding surface for bonding to the base wafer 10.

Also, in the SOI wafer 100 of the second example shown in FIG. 2, the SOI-side silicon oxide film 22 disposed on the one main surface 32 of the SOI layer 30 is bonded to the barrier silicon oxide film 21 disposed on the first main surface 11 of the base wafer 10 to constitute the buried oxide film 20. In other words, the SOI wafer 100 of the second example includes the barrier silicon oxide film 21 as a part of the buried oxide film 20 and the SOI-side silicon oxide film 22 as another part of the buried oxide film 20.

Third Example

FIG. 3 is a schematic cross-sectional view showing a third example of the inventive SOI wafer.

The SOI wafer 100 of the third example shown in FIG. 3 is similar to the first example SOI wafer 100, except that a barrier silicon layer 60 is disposed between the base wafer 10 and the barrier silicon oxide film 21.

<Method for Manufacturing SOI Wafer>

The inventive method for manufacturing an SOI wafer is now described.

The inventive method for manufacturing an SOI wafer at least includes:

a step of providing a base wafer and a bond wafer, the base wafer comprising a silicon single crystal wafer containing a dopant across the wafer and having a first main surface and a second main surface opposite the first main surface, the bond wafer comprising a silicon single crystal wafer containing a dopant at a lower concentration than a dopant concentration of the base wafer;

a thermal oxidation step of forming a silicon oxide film on an entire surface of the base wafer by thermal oxidation;

a bonding step of bonding one main surface of the bond wafer to the first main surface of the base wafer via the silicon oxide film on the base wafer; and a thinning step of thinning the bond wafer to form an SOI layer, wherein the method further comprises, prior to the thermal oxidation step for the base wafer:

a step of forming a CVD insulator film on the second main surface of the base wafer; and a step of forming a barrier silicon layer on the first main surface of the base wafer, the barrier silicon layer containing a dopant at a lower concentration than the dopant concentration of the base wafer, wherein in the thermal oxidation step, the barrier silicon layer is thermally oxidized to produce a barrier silicon oxide film as a part of the silicon oxide film, and in the bonding step, the one main surface of the bond wafer is bonded to the first main surface of the base wafer via the barrier silicon oxide film as a part of the silicon oxide film.

Such an inventive method for manufacturing an SOI wafer can produce, in the bonding step, an SOI wafer in which a CVD insulator film is formed on the second main surface of the base wafer opposite its bonding surface (first main surface) for bonding to the bond wafer, and the first main surface of the base wafer is bonded to the one main surface of the bond wafer via the barrier silicon oxide film. The barrier silicon oxide film contains a dopant at a lower concentration than the dopant concentration of the base wafer. Such an SOI wafer can not only block autodoping of the bond wafer from the second main surface of the base wafer by virtue of the CVD insulator film, but also it can suppress autodoping caused by solid phase diffusion from the first main surface of the base wafer into the bond wafer because the barrier silicon oxide film can serve as a dopant diffusion prevention layer. Additionally, since the silicon oxide film is formed on the entire surface of the base wafer by thermal oxidation during the thermal oxidation step for the base wafer, the SOI wafer can also suppress outward diffusion of the dopant from the terrace and edge portions of the base wafer by virtue of this silicon oxide film.

Thus, the inventive method for manufacturing an SOI wafer can suppress incorporation of the dopant contained in the base wafer into the bond wafer or the SOI layer by outward diffusion through the silicon oxide film on the backside, second main surface of the base wafer, or into the bond wafer or the SOI layer by solid phase diffusion through the silicon oxide film between the base wafer and the bond wafer or the SOI layer, during, for example, the bonding step and its subsequent steps. In particular, the inventive method can suppress such dopant incorporation into the SOI layer even during the steps involving heat treatment.

That is, according to the inventive method for manufacturing an SOI wafer, an SOI wafer can be manufactured while suppressing contamination of the SOI layer caused by incorporation of the dopant contained in the base wafer. With this capability of preventing autodoping, the inventive method can prevent changes in the conductivity type or resistivity of the SOI layer.

Further, when devices are manufactured by using SOI wafers manufactured according to the inventive method for manufacturing an SOI wafer, it is also possible to suppress incorporation of the dopant contained in the base wafer into the SOI layer by outward diffusion through the silicon oxide film on the backside, second main surface of the base wafer, or into the SOI layer by solid phase diffusion from the silicon oxide film as the buried oxide film of the SOI wafer.

Additionally, when devices are manufactured using SOI wafers manufactured by the inventive method for manufacturing an SOI wafer, outward diffusion of the dopant through the second main surface of the base wafer can be suppressed, so that it is also possible to sufficiently suppress dopant contamination into furnace components in a heat treatment furnace, which will also have the effect of suppressing secondary contamination from the furnace components to the wafer.

Further, with the use of a dopant-containing base wafer, the inventive method for manufacturing an SOI wafer can manufacture an SOI wafer that can suppress warpage and exhibit an excellent gettering effect.

The inventive method for manufacturing an SOI wafer is now further detailed.

The inventive method for manufacturing an SOI wafer at least includes a step of providing a base wafer and a bond wafer, a thermal oxidation step for the base wafer, a bonding step, and a thinning step, and further includes, prior to the thermal oxidation step for the base wafer, a step of forming a CVD insulator film and a step of forming a barrier silicon layer.

The inventive method for manufacturing an SOI wafer may further include, prior to the bonding step, a step of forming a silicon oxide film on the entire surface of the bond wafer.

The inventive method for manufacturing an SOI wafer may further include, prior to the bonding step, an ion implantation step of implanting at least one kind of ions selected from the group consisting of hydrogen ion and rare gas ions into the bond wafer to form an ion implanted layer. In such cases, the bond wafer may be delaminated with the ion implanted layer used as a delaminating plane in the thinning step to thereby thin the bond wafer to produce the SOI layer.

The inventive method for manufacturing an SOI wafer may further include other steps.

The steps of the inventive method for manufacturing an SOI wafer are now described in greater detail.

(Step of Providing Base Wafer and Bond Wafer)

In this step, the base wafer and the bond wafer are provided, where the base wafer comprises a silicon single crystal wafer containing a dopant across the wafer and having a first main surface and a second main surface opposite the first main surface, and the bond wafer comprises a silicon single crystal wafer containing a dopant at a lower concentration than a dopant concentration of the base wafer.

The base wafer to be provided may be the base wafer mentioned in the description of the inventive SOI wafer. In particular, using the base wafer with the dopant concentration of $1\times10^{17}$ atoms/cm$^3$ or more can exhibit an excellent gettering effect and more greatly suppress warpage of the SOI wafer to be manufactured. Additionally, for the reasons mentioned above, the inventive method for manufacturing an SOI wafer can suppress incorporation of the dopant contained in the base wafer into the bond wafer or the SOI layer even with the use of the base wafer with the dopant concentration therein of $1\times10^{17}$ atoms/cm$^3$ or more.

As mentioned above, the upper limit for the dopant concentration of the base wafer is not particularly limited, and can be at or below the solid solubility limit of that dopant in the silicon single crystal. The dopant concentration of the base wafer is preferably $1\times10^{17}$ atoms/cm$^3$ or more and $1\times10^{20}$ atoms/cm$^3$ or less.

The bond wafer becomes the SOI layer in the thinning step to be described below. Accordingly, it is preferred to provide the bond wafer that has a conductivity type and resistivity required for the SOI layer of the SOI wafer to be manufactured. Specifically, the bond wafer to be provided can be the bond wafer made of a silicon single crystal for the SOI layer mentioned in the description of the inventive SOI wafer.

(Step of Forming Silicon Oxide Film on the Entire Surface of Bond Wafer)

In this optional step, a silicon oxide film is formed on the entire surface of the provided bond wafer, prior to the bonding step to be described below.

The means of forming the silicon oxide film is not particularly limited, and, for example, the silicon oxide film can be formed by thermally oxidizing the surface of the bond wafer.

(Ion Implantation Step)

In this optional step, at least one kind of ions selected from the group consisting of hydrogen ion and rare gas ions is implanted into the bond wafer to form an ion implanted layer.

The means of implanting the ions is not particularly limited, and any known method can be employed.

(Step of Forming CVD Insulator Film)

In this step, a CVD insulator film is formed on the second main surface of the base wafer (backside relative to its bonding surface (first main surface) for the bond wafer).

For example, the CVD insulator film can be formed by placing the base wafer on a susceptor inside a CVD furnace with its first main surface facing down and depositing the CVD insulator film on its opposite, second main surface by a chemical vapor deposition (CVD) method.

In particular, it is preferred to form any one of a CVD oxide film, a CVD nitride film, and a CVD oxynitride film as the CVD insulator film.

These films are not only easy to form, but also can be dense CVD insulator films. Thus, outward diffusion of the dopant through the second main surface of the base wafer opposite its first main surface can be more reliably suppressed.

For further details on the functions and effects provided by forming the CVD insulator film on the second main surface of the base wafer, see paragraphs [0028]-[0041] of Patent Document 3.

(Step of Forming Barrier Silicon Layer)

In this step, a barrier silicon layer containing a dopant at a lower concentration than the dopant concentration of the base wafer is formed on the first main surface of the base wafer.

The barrier silicon layer can be formed on the first main surface of the base wafer by, for example, epitaxial growth.

It is preferred to form a layer with a dopant concentration of $1\times10^{16}$ atoms/cm$^3$ or less as the barrier silicon layer.

Forming such a barrier silicon layer can more reliably suppress incorporation of the dopant into the SOI layer caused by solid phase diffusion through the silicon oxide film disposed on the first main surface of the base wafer.

The dopant concentration of the barrier silicon layer can be such that it is in a so-called undoped state and at most contains a dopant that is inevitably incorporated. In other words, the dopant concentration in the barrier silicon layer can be greater than 0. The dopant to be contained in the barrier silicon layer may be of the same kind as, or of a different kind from, the dopant contained in the base wafer.

The film thickness of the barrier silicon layer is not particularly limited, and for example can be equal to or greater than a half of the total thickness of the silicon oxide film (buried oxide film) between the SOI layer and the base wafer of the SOI wafer to be produced by the inventive method for manufacturing an SOI wafer. With the barrier silicon layer with such a film thickness formed and turned into a barrier silicon oxide film during a thermal oxidation step as described below, any incorporation of the dopant by solid phase diffusion from the first main surface of the base wafer into the bond wafer or the SOI layer to be produced by thinning the bond wafer can be more sufficiently suppressed. The film thickness of the barrier silicon oxide film is preferably 400 nm or more, more preferably 500 nm or more, and even more preferably 600 nm or more. The film thickness of the barrier silicon oxide film can be 1000 nm or less, for example.

Should be noted that increasing the thickness of the barrier silicon layer facilitates suppressing the diffusion of the dopant from the base wafer. However, if the layer with a low dopant concentration is too thick relative to the thickness of the buried oxide film (BOX layer) of the SOI wafer, the layer with a low dopant concentration will be created directly below the BOX layer. When the manufacture of such an SOI wafer is unwanted, one preferred method for preventing this is to reduce the thickness of the barrier silicon layer, for example, make it about half the thickness of the buried oxide film of the SOI wafer to be manufactured, which is here based on an oxidation ratio of $Si/SiO_2=0.45$ (film thickness ratio between an Si layer and an $SiO_2$ layer when the entire Si layer is changed into the $SiO_2$ layer by thermal oxidation).

The inventive method for manufacturing an SOI wafer can manufacture an SOI wafer in which the first main surface of the base wafer includes a portion that does not support the SOI layer thereon, i.e., a terrace portion. In such cases, in the step of forming the barrier silicon layer, the barrier silicon layer may also be formed on the portion of the first main surface of the base wafer to be the terrace portion. By turning the barrier silicon layer into the barrier silicon oxide film through the thermal oxidation step as described below, a portion of the barrier silicon layer formed on the terrace portion also becomes a part of the barrier silicon oxide film. This part of the barrier silicon oxide film can suppress outward diffusion of the dopant from the terrace portion of the SOI wafer.

Thus, even in cases where the base wafer includes a portion on which the SOI layer is not formed, i.e., the terrace portion, the barrier silicon oxide film can prevent the dopant from being incorporated into the SOI layer through this terrace portion.

Additionally, when SOI wafers including the terrace portion are manufactured by the inventive method for manufacturing an SOI wafer and these SOI wafers are used for the manufacture of devices, not only outward diffusion of the dopant through the second main surface of the base wafer but also outward diffusion of the dopant through the silicon oxide film on the terrace portion of the SOI wafer can be suppressed. This in turn can sufficiently suppress dopant contamination to furnace components in a heat treatment furnace, which will also obtain the effect of suppressing secondary contamination from the furnace components to the wafer.

It should be noted that the order of the steps of forming the CVD insulator film and forming the barrier silicon layer, which are performed prior to the thermal oxidation step for the base wafer, is not particularly limited. Also, in order to reduce bonding defects, bonding-side surface (i.e., the barrier silicon layer) of the base wafer with both of the CVD insulator film and the barrier silicon layer formed thereon may be subjected to a repolishing prior to the thermal oxidation step.

(Thermal Oxidation Step)

In this step, a silicon oxide film is formed on the entire surface of the base wafer by thermal oxidation. Also, in this step, the barrier silicon layer formed on the first main surface of the base wafer is thermally oxidized to produce a barrier silicon oxide film as a part of the silicon oxide film to be formed on the entire surface of the base wafer.

In this step, thermal oxidation may be performed such that a part of the barrier silicon layer remains unoxidized.

When the silicon oxide film for providing at least a part of the buried oxide film (BOX layer) is formed in the thermal oxidation step through thermal oxidation that is performed such that the barrier silicon layer is not fully oxidized and some unoxidized thickness remains, a layer of the unoxidized part of the barrier silicon layer with a low dopant concentration will be created directly below the silicon oxide film. In such cases, dopant-diffusing heat treatment (annealing) can be applied after the thermal oxidation step to compensate for the dopant concentration directly below the silicon oxide film. This diffusing heat treatment can be compensated for by bonding heat treatment or extension of the heat treatment duration.

Alternatively, the entire barrier silicon layer may be thermally oxidized into the barrier silicon oxide film, and a portion of the base wafer directly below the barrier silicon layer may further be thermally oxidized.

The degree of thermal oxidation can be adjusted via the temperature and duration of the thermal oxidation, for example.

As this thermal oxidation proceeds into the base wafer through the CVD insulator film formed on the second main surface of the base wafer, this thermal oxidation step also enables a portion of the base wafer in contact with the CVD insulator film to turn into the silicon oxide film (referred to as a backside silicon oxide film). Thus, through this thermal oxidation step, the main surface of the base wafer on which the backside silicon oxide film is disposed becomes the new second main surface.

Of the silicon oxide films produced by this thermal oxidation, the barrier silicon oxide film results from thermal oxidation of at least a part of the barrier silicon layer, and the backside silicon oxide film results from thermal oxidation of a part of the base wafer. Since the dopant concentration of the barrier silicon layer is lower than that of the base wafer, the dopant concentration of the barrier silicon oxide film is to be lower than that of the backside silicon oxide film.

(Bonding Step)

In this step, one main surface of the bond wafer is bonded to the first main surface of the base wafer via the silicon oxide film on the base wafer.

If the silicon oxide film is formed on the entire surface of the bond wafer prior to this bonding step, the base wafer can be bonded to the bond wafer in the bonding step via the silicon oxide film disposed on the first main surface of the base wafer and the silicon oxide film disposed on the bond wafer. By performing the bonding step in this manner, incorporation of the dopant into the bond wafer or the SOI layer from the first main surface of the base wafer can be more reliably suppressed.

Alternatively, in this bonding step, the silicon single crystal surface in the one main surface of the bond wafer may be directly bonded to the surface of the barrier silicon oxide film of the base wafer.

Even without the formation of the silicon oxide film on the bond wafer, incorporation of the dopant into the SOI layer by solid phase diffusion through the silicon oxide film disposed on the first main surface of the base wafer can be sufficiently suppressed. Such an embodiment is especially advantageous in situations when bonding of oxide films is not available (e.g., when high-temperature heat treatment is not available in the bonding step).

(Thinning Step)

In this step, the bond wafer is thinned to form an SOI layer.

The means of thinning is not particularly limited, and grinding, polishing, etching, or the like may be employed. However, the thinning is preferably performed by an ion implantation delamination method. When performing an ion implantation delamination method, the ion implantation step as described above is performed in advance to form an ion implanted layer on the bond wafer. Then, the bond wafer is delaminated at this ion implanted layer used as a delaminating plane, whereby the bond wafer can be thinned to produce an SOI layer.

Performing such an ion implantation delamination method can produce a thinned SOI layer with excellent film thickness uniformity.

Following the thinning step, steps such as a sacrificial oxidation treatment step, a flattening heat treatment step, a polishing step, a mirror finishing step, and a cleaning step may be performed.

The inventive method for manufacturing an SOI wafer can produce an SOI wafer through the thinning step or any optional subsequent step(s). Further, the inventive method for manufacturing an SOI wafer can manufacture the inventive SOI wafer described above, for example.

Next, some specific examples of the inventive method for manufacturing an SOI wafer are described with reference to FIGS. 4 and 5. However, the inventive method for manufacturing an SOI wafer is not limited to the examples below.

First Example

FIG. 4 is a schematic flowchart showing a first example of the inventive method for manufacturing an SOI wafer. The manufacturing method of this example can manufacture, for example, the first example SOI wafer of the first example described with reference to FIG. 1.

First, at step (a), the base wafer 10 and a bond wafer 31 are provided. The base wafer 10 includes the first main surface 11 facing upward in FIG. 4, the second main surface 12 opposite the first main surface 11, and a side surface (edge portion) 13 connecting the first main surface 11 and the second main surface 12. The bond wafer 31 includes one main surface 32 that is to be later bonded to the first main surface 11 of the base wafer 10. Both of the base wafer 10 and the bond wafer 31 contain a dopant, and the base wafer 10 has a higher dopant concentration.

Next, at step (b), the CVD insulator film 40 is formed on the second main surface 12 of the base wafer 10 provided at step (a).

Next, at step (c), the barrier silicon layer 60 is formed on the first main surface 11 of the base wafer 10. The dopant concentration of the barrier silicon layer 60 is lower than that of the base wafer 10.

Next, at step (d), the base wafer 10 is subjected to thermal oxidation to produce the silicon oxide film 50. In this example, at this thermal oxidation step (d), the entire barrier silicon layer 60 is turned into the barrier silicon oxide film 21. The portion of the base wafer 10 that included the second main surface 12 is also turned into the backside silicon oxide film 51, resulting in the new second main surface 12 in contact with this backside oxide film 51 being created in the base wafer 10. Further, the side silicon oxide film 52 is formed on the side surface 13 of the base wafer 10. The barrier silicon oxide film 21, the backside oxide film 51, and the side silicon oxide film 52 form the silicon oxide film 50 covering the entire surfaces of the base wafer 10.

Next, at step (e), the one main surface 32 of the bond wafer 31 provided at step (a) is bonded to the first main surface 11 of the base wafer 10 subjected to thermal oxidation at step (d) via the silicon oxide film 50, more specifically the barrier silicon oxide film 21.

Next, at step (f), the bond wafer 31 is thinned to produce the SOI layer 30.

The thinning step (f) can also be performed by the ion implantation delamination method if the ion implantation step of implanting at least one kind of ions selected from the group consisting of hydrogen ion and rare gas ions into the bond wafer 31 to form an ion implanted layer is performed prior to the bonding step (e).

Performing the thinning step (f) can produce the SOI wafer 100 of the first example shown in FIG. 1.

With a lesser degree of thermal oxidation at the thermal oxidation step (d), the SOI wafer 100 of the third example shown in FIG. 3 can also be produced.

Second Example

FIG. 5 is a schematic flowchart showing a second example of the inventive method for manufacturing an SOI wafer. The manufacturing method of this example can manufacture, for example, the SOI wafer of the second example described with reference to FIG. 2.

The manufacturing method of the second example differs from the manufacturing method of the first example in that it includes step (g) of forming a silicon oxide film 34 on the entire surfaces of the bond wafer 31 provided at step (a), including the one main surface 32 for bonding to the base wafer 10, an opposite main surface (backside) 36, and a side surface (edge portion) 33 connecting these main surfaces.

The silicon oxide film 34 formed at step (g) includes an SOI-side silicon oxide film 22 formed on the one main surface 32 of the bond wafer 31, a backside silicon oxide film 37 formed on the main surface 36, and a side silicon oxide film 35 formed on the side surface 33.

In the manufacturing method of the second example, at the bonding step (e), the base wafer 10 is bonded to the bond wafer 31 via the barrier silicon oxide film 21 and the SOI-side silicon oxide film 22.

Furthermore, in the manufacturing method of the second example, at the thinning step (f), the portion of the bond wafer 31 including the portion on which the backside silicon oxide film 37 is formed is delaminated to produce the SOI layer 30. Performing the thinning step (f) in this manner can produce the SOI wafer 100 of the second example shown in FIG. 2.

[Measurement Method]

The dopant concentration in the base wafer, the bond wafer, the barrier silicon layer, the barrier silicon oxide film, the backside silicon oxide film etc. can be measured using a secondary ion mass spectrometer (SIMS), for example.

The thickness of each component included in the SOI wafer, as well as the thickness of each wafer provided and each layer formed in the method for manufacturing an SOI wafer can be determined by, for example, cross-sectional SEM, optical reflectometry, ellipsometry, etc.

EXAMPLES

The present invention is described below in detail using Examples and Comparative Examples, although the present invention is not limited thereto.

Example 1

In Example 1, the SOI wafer 100 was manufactured according to a flow similar to that schematically illustrated in FIG. 4.

<Step (a)>

First, a 300 mm diameter, boron-doped (dopant concentration: $1\times10^{15}$ atoms/cm$^3$) p-type silicon single crystal wafer (resistivity: 10 Ωcm) was provided as the bond wafer 31. Also, a 300 mm diameter, boron-doped (dopant concentration: $1\times10^{17}$ atoms/cm$^3$) p-type silicon single crystal wafer (resistivity: 0.1 Ωcm) was provided as the base wafer 10.

Hydrogen ions were implanted into the provided bond wafer 31 from the one main surface 32, the bonding surface under the conditions shown in Table 1 below to form an ion implanted layer.

<Step (b)>

The base wafer 10 was placed on a susceptor inside a CVD furnace with the first main surface 11, the bonding surface, facing down and a CVD oxide film as the CVD insulator film 40 was formed on the second main surface 12 by a CVD method. The formed CVD oxide film was 300 nm thick.

<Step (c)>

The barrier silicon layer 60 was epitaxially grown on the first main surface 11, the bonding surface, of the base wafer 10. The barrier silicon layer had a p-type conductivity, a thickness of 400 nm, a resistivity of 10 Ωcm, and a dopant concentration of $1\times10^{15}$ atoms/cm$^3$.

<Step (d)>

The entire surfaces of the base wafer 10 were thermally oxidized to form the silicon oxide film 50 covering the entire surfaces of the base wafer 10.

The thermal oxidation was performed to make the silicon oxide film 50 1000 nm thick. Thus, the entire barrier silicon layer 60 was oxidized into the barrier silicon oxide film 21 through this thermal oxidation step (d). Also, the portion of the base wafer 10 including the second main surface was oxidized into the backside silicon oxide film 51.

<Step (e)>

The base wafer 10 subjected to the thermal oxidation at step (d) was bonded to the bond wafer 31 formed with the ion implanted layer such that the barrier silicon oxide film 21 was in contact with the one main surface 32 of the bond wafer 31.

<Step (f)>

Delaminating heat treatment was applied to the bonded wafers at 500° C. under an argon atmosphere for 30 minutes to delaminate the bond wafer 31 at the ion implanted layer used as a delaminating plane to thereby thin the bond wafer 31 to produce the SOI layer 30.

Then, sacrificial oxidation treatment was applied under the conditions shown in Table 1 below to remove any damages in the SOI layer 30. This sacrificial oxidation treatment also serves as bonding heat treatment to increase the bonding between the wafers. Further, flattening heat treatment was applied under the conditions shown in Table 1 below to manufacture the SOI wafer 100.

Examples 2 and 3 and Comparative Examples 1-3

The SOI wafer 100 of each example was manufactured under the same conditions as in Example 1, except that the manufacturing conditions shown in respective Tables 1-3 below were employed.

<Evaluation>

The dopant concentration in the SOI layer 30 of the SOI wafer 100 of each example was measured using the SIMS. The respective results are shown in Tables 1-3 below.

TABLE 1

| | Example 1 | Comparative Example 1 |
|---|---|---|
| Bond wafer | 300 mm diameter, p-type (boron-doped), 10 Ωcm (dopant concentration: $1\times10^{15}$ atoms/cm$^3$) | |
| Base wafer | 300 mm diameter, p-type (boron-doped), 0.1 Ωcm (dopant concentration: $1\times10^{17}$ atoms/cm$^3$) | |
| Barrier silicon layer (formation method, thickness) (conductivity type, resistivity) | Epi-growth, 400 nm p-type, 10 Ωcm | None |
| Thickness of CVD oxide film (CVD insulator film) | 300 nm | None |
| Thickness of buried oxide film | 1000 nm | The same as left |
| Hydrogen ion implantation conditions | Implantation energy: 50 keV Dosage: $5\times10^{16}$/cm$^2$ | |
| Delaminating heat treatment conditions | Argon atmosphere, 500° C., 30 minutes | |
| Sacrificial oxidation treatment conditions | (Oxidation): 900° C., 1 hour, wet oxidation (Oxide film removal): 5% HF aqueous solution | |
| Flattening heat treatment conditions | 100% Ar atmosphere, 1200° C., 1 hour | |
| SOI layer boron concentration measurement results (SIMS) | $1\times10^{15}$ atoms/cm$^3$ | $4\times10^{15}$ atoms/cm$^3$ |

TABLE 2

| | Example 2 | Comparative Example 2 |
|---|---|---|
| Bond wafer | 300 mm diameter, p-type (boron-doped), 10 Ωcm (dopant concentration: $1\times10^{15}$ atoms/cm$^3$) | |
| Base wafer | 300 mm diameter, p-type (boron-doped), 0.017 Ωcm (dopant concentration: $1\times10^{19}$ atoms/cm$^3$) | |
| Barrier silicon layer (formation method, thickness) (conductivity type, resistivity) | Epi-growth, 500 nm p-type, 10 Ωcm | None |
| Thickness of CVD oxide film (CVD insulator film) | 300 nm | The same as left |
| Thickness of buried oxide film | 1000 nm | The same as left |

TABLE 2-continued

| | Example 2 | Comparative Example 2 |
|---|---|---|
| Hydrogen ion implantation conditions | Implantation energy: 50 keV Dosage: $5 \times 10^{16}/cm^2$ | |
| Delaminating heat treatment conditions | Argon atmosphere, 500° C., 30 minutes | |
| Sacrificial oxidation treatment conditions | (Oxidation): 900° C., 1 hour, wet oxidation (Oxide film removal): 5% HF aqueous solution | |
| Flattening heat treatment conditions | 100% Ar atmosphere, 1200° C., 1 hour | |
| SOI layer boron concentration measurement results (SIMS) | $1 \times 10^{15}$ atoms/cm$^3$ | $3 \times 10^{17}$ atoms/cm$^3$ |

TABLE 3

| | Example 3 | Comparative Example 3 |
|---|---|---|
| Bond wafer | 300 mm diameter, p-type (boron-doped), 10 Ωcm (dopant concentration: $5 \times 10^{14}$ atoms/cm$^3$) | |
| Base wafer | 300 mm diameter, n-type (phosphorus-doped), 0.1 Ωcm (dopant concentration: $1 \times 10^{17}$ atoms/cm$^3$) | |
| Barrier silicon layer (formation method, thickness) (conductivity type, resistivity) | Epi-growth, 1000 nm p-type, 10 Ωcm | None |
| Thickness of CVD oxide film (CVD insulator film) | 300 nm | The same as left |
| Thickness of buried oxide film | 1000 nm | The same as left |
| Hydrogen ion implantation conditions | Implantation energy: 50 keV Dosage: $5 \times 10^{16}/cm^2$ | |
| Delaminating heat treatment conditions | Argon atmosphere, 500° C., 30 minutes | |
| Sacrificial oxidation treatment conditions | (Oxidation): 900° C., 1 hour, wet oxidation (Oxide film removal): 5% HF aqueous solution | |
| Flattening heat treatment conditions | 100% Ar atmosphere, 1200° C., 1 hour | |
| SOI layer phosphorus concentration measurement results (SIMS) | Below the lower limit for phosphorus detection | phosphorus $1 \times 10^{15}$ atoms/cm$^3$ |

Comparison between the results of Example 1 and Comparative Example 1 shown in Table 1 demonstrates that the SOI wafer of Example 1, in which the barrier silicon layer and the CVD insulator film were formed, was able to notably suppress an increase in boron concentration in the SOI layer caused by incorporation of boron from the base wafer, as compared to the SOI wafer of Comparative Example 1, in which neither of the barrier silicon layer and the CVD insulator film was formed. Also, comparison between the results of Example 2 and Comparative Example 2 shown in Table 2 demonstrates that the SOI wafer of Example 2, in which the barrier silicon layer and the CVD insulator film were formed, was able to notably suppress an increase in boron concentration in the SOI layer caused by incorporation of boron from the base wafer, as compared to the SOI wafer of Comparative Example 2, in which the CVD insulator film was formed but no barrier silicon layer was formed. Also, comparison between the results of Example 3 and Comparative Example 3 shown in Table 3 demonstrates that the SOI wafer of Example 3, in which the barrier silicon layer and the CVD insulator film were formed, was able to notably suppress an increase in phosphorus concentration in the SOI layer caused by incorporation of phosphorus from the base wafer, as compared to the SOI wafer of Comparative Example 3, in which the CVD insulator film was formed but no barrier silicon layer was formed.

Example 4

In Example 4, conducted was the simulation of a relationship between the thickness of the barrier silicon layer (epi-layer) and the boron concentration in the SOI layer near the SOI layer/buried oxide film (BOX layer) interface when the SOI wafer was fabricated under the same conditions as in Example 2, except that the thickness of the barrier silicon layer to be formed was varied. The results calculated on the chart are shown in FIG. 6.

FIG. 6 and Table 2 demonstrate that forming a barrier silicon layer can notably suppress an increase in boron concentration in the SOI layer, as compared to Comparative Example 2, where no barrier silicon layer was formed. Also, FIG. 6 demonstrates that forming a barrier silicon layer of 400 nm can constrain an increase in boron concentration in the SOI layer to within a factor of two and, what is more, that forming a barrier silicon layer of 500 nm, which is half the thickness of the buried oxide film to be formed later, can almost completely suppress an increase in boron concentration in the SOI layer.

Example 5

In Example 5, conducted was the simulation under the same conditions as in Example 4, except that the buried oxide film was 2 μm thick. Simulation results calculating a relationship between the thickness of the barrier silicon layer (epi-layer) and the boron concentration in the SOI layer near the SOI layer/buried oxide film interface are shown in FIG. 7.

FIG. 7 and Table 2 demonstrate that, even with the thickness of the buried oxide film increased to 2 μm, forming a barrier silicon layer can notably suppress an increase in boron concentration in the SOI layer, as compared to Comparative Example 2, where no barrier silicon layer was formed.

FIG. 7 also demonstrates that, even with the thickness of the buried oxide film increased to 2 μm, forming a barrier silicon layer of about 400-500 nm can sufficiently suppress an increase in boron concentration in the SOI layer, as is the case when the buried oxide film is 1 μm thick.

This means that, while an oxide film heavily-containing boron of the heavily-doped base wafer is formed in a latter portion of the 2 μm thick buried oxide film (portion distant from the SOI layer), the diffusion rate of boron in the buried oxide film including the barrier silicon oxide film, which is formed by oxidation of the barrier silicon layer, is so slow that the boron do not diffuse into the SOI layer, having no effect on the boron concentration in the SOI layer. Accordingly, this suggests that, even when the buried oxide film is made as thick as more than 2 μm, forming a barrier silicon layer can suppress an increase in dopant concentration in the SOI layer, and that the barrier silicon layer is preferably about 400-500 nm thick, and even considering a margin of safety, forming a barrier silicon layer of about 600-1000 nm will be sufficient.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for manufacturing an SOI wafer, at least comprising:

- a step of providing a base wafer and a bond wafer, the base wafer comprising a silicon single crystal wafer containing a dopant across the wafer and having a first main surface and a second main surface opposite the first main surface, the bond wafer comprising a silicon single crystal wafer containing a dopant at a lower concentration than a dopant concentration of the base wafer;
- a thermal oxidation step of forming a silicon oxide film on an entire surface of the base wafer by thermal oxidation;
- a bonding step of bonding one main surface of the bond wafer to the first main surface of the base wafer via the silicon oxide film on the base wafer; and
- a thinning step of thinning the bond wafer to form an SOI layer, wherein
- the method further comprises, prior to the thermal oxidation step for the base wafer:
- a step of forming a CVD insulator film on the second main surface of the base wafer; and
- a step of forming a barrier silicon layer on the first main surface of the base wafer, the barrier silicon layer containing a dopant at a lower concentration than the dopant concentration of the base wafer, wherein
- in the thermal oxidation step, the barrier silicon layer is thermally oxidized to produce a barrier silicon oxide film as a part of the silicon oxide film, and
- in the bonding step, the one main surface of the bond wafer is bonded to the first main surface of the base wafer via the barrier silicon oxide film as a part of the silicon oxide film.

2. The method for manufacturing an SOI wafer according to claim 1, further comprising a step of forming a silicon oxide film on an entire surface of the bond wafer prior to the bonding step.

3. The method for manufacturing an SOI wafer according to claim 2, further comprising, prior to the bonding step, an ion implantation step of implanting at least one kind of ions selected from a group consisting of hydrogen ion and rare gas ions into the bond wafer to form an ion implanted layer, wherein

- in the thinning step, the bond wafer is delaminated with the ion implanted layer used as a delaminating plane to thereby thin the bond wafer to produce the SOI layer.

4. The method for manufacturing an SOI wafer according to claim 2, wherein, in the step of forming the CVD insulator film, any one of a CVD oxide film, a CVD nitride film, and a CVD oxynitride film is formed as the CVD insulator film.

5. The method for manufacturing an SOI wafer according to claim 2, wherein a wafer with the dopant concentration of $1\times10^{17}$ atoms/$cm^3$ or more is provided as the base wafer.

6. The method for manufacturing an SOI wafer according to claim 2, wherein a layer with a dopant concentration of $1\times10^{16}$ atoms/$cm^3$ or less is formed as the barrier silicon layer.

7. The method for manufacturing an SOI wafer according to claim 2, wherein

- in the thermal oxidation step, thermal oxidation is performed such that a part of the barrier silicon layer remains unoxidized, and
- annealing is subsequently applied to diffuse the dopant in the base wafer into a layer of the unoxidized part of the barrier silicon layer.

8. The method for manufacturing an SOI wafer according to claim 1, wherein, in the bonding step, a silicon single crystal surface in the one main surface of the bond wafer is directly bonded to a surface of the barrier silicon oxide film of the base wafer.

9. The method for manufacturing an SOI wafer according to claim 8, further comprising, prior to the bonding step, an ion implantation step of implanting at least one kind of ions selected from a group consisting of hydrogen ion and rare gas ions into the bond wafer to form an ion implanted layer, wherein

- in the thinning step, the bond wafer is delaminated with the ion implanted layer used as a delaminating plane to thereby thin the bond wafer to produce the SOI layer.

10. The method for manufacturing an SOI wafer according to claim 8, wherein, in the step of forming the CVD insulator film, any one of a CVD oxide film, a CVD nitride film, and a CVD oxynitride film is formed as the CVD insulator film.

11. The method for manufacturing an SOI wafer according to claim 8, wherein a wafer with the dopant concentration of $1\times10^{17}$ atoms/$cm^3$ or more is provided as the base wafer.

12. The method for manufacturing an SOI wafer according to claim 8, wherein a layer with a dopant concentration of $1\times10^{16}$ atoms/$cm^3$ or less is formed as the barrier silicon layer.

13. The method for manufacturing an SOI wafer according to claim 8, wherein

- in the thermal oxidation step, thermal oxidation is performed such that a part of the barrier silicon layer remains unoxidized, and
- annealing is subsequently applied to diffuse the dopant in the base wafer into a layer of the unoxidized part of the barrier silicon layer.

14. The method for manufacturing an SOI wafer according to claim 1, further comprising, prior to the bonding step, an ion implantation step of implanting at least one kind of ions selected from a group consisting of hydrogen ion and rare gas ions into the bond wafer to form an ion implanted layer, wherein

- in the thinning step, the bond wafer is delaminated with the ion implanted layer used as a delaminating plane to thereby thin the bond wafer to produce the SOI layer.

15. The method for manufacturing an SOI wafer according to claim 1, wherein, in the step of forming the CVD insulator film, any one of a CVD oxide film, a CVD nitride film, and a CVD oxynitride film is formed as the CVD insulator film.

16. The method for manufacturing an SOI wafer according to claim 1, wherein a wafer with the dopant concentration of $1\times10^{17}$ atoms/$cm^3$ or more is provided as the base wafer.

17. The method for manufacturing an SOI wafer according to claim 1, wherein a layer with a dopant concentration of $1\times10^{16}$ atoms/$cm^3$ or less is formed as the barrier silicon layer.

18. The method for manufacturing an SOI wafer according to claim 1, wherein in the thermal oxidation step, thermal oxidation is performed such that a part of the barrier silicon layer remains unoxidized, and annealing is subsequently applied to diffuse the dopant in the base wafer into a layer of the unoxidized part of the barrier silicon layer.

19. An SOI wafer comprising:

a base wafer;

a buried oxide film; and an SOI layer bonded to the base wafer via the buried oxide film, wherein the base wafer comprises a silicon single crystal wafer containing a dopant across the wafer and having a first main surface and a second main surface opposite the first main surface, the first main surface being a bonding surface for bonding to the SOI layer, a barrier silicon oxide film as at least a part of the buried oxide film is disposed on the first main surface of the base wafer, a backside silicon oxide film is disposed on the second main surface of the base wafer, a CVD insulator film is disposed on a surface of the backside silicon oxide film facing away from the base wafer, the SOI layer comprises a silicon single crystal containing a dopant at a lower concentration than a dopant concentration of the base wafer, a concentration of a dopant in the barrier silicon oxide film is lower than a concentration of a dopant in the backside silicon oxide film, and a barrier silicon layer is disposed between the base wafer and the barrier silicon oxide film, and a dopant of a same kind as the dopant contained in the base wafer is diffused in the barrier silicon layer.

* * * * *